United States Patent
Wu

(10) Patent No.: US 8,802,503 B2
(45) Date of Patent: Aug. 12, 2014

(54) PROCESSES FOR MANUFACTURING AN LED PACKAGE WITH TOP AND BOTTOM ELECTRODES

(71) Applicant: Cheng Kung Capital, LLC, Wilmington, DE (US)

(72) Inventor: Jiahn-Chang Wu, Chutung (TW)

(73) Assignee: Cheng Kung Capital, LLC, Wilmington, DE (US)

( * ) Notice: Subject to any disclaimer, the term of this patent is extended or adjusted under 35 U.S.C. 154(b) by 0 days.

(21) Appl. No.: 14/205,318

(22) Filed: Mar. 11, 2014

(65) Prior Publication Data
US 2014/0193930 A1 Jul. 10, 2014

Related U.S. Application Data

(62) Division of application No. 14/014,324, filed on Aug. 29, 2013, now Pat. No. 8,710,540, which is a division of application No. 13/548,067, filed on Jul. 12, 2012, now Pat. No. 8,524,541, which is a division of application No. 12/554,189, filed on Sep. 4, 2009, now Pat. No. 8,247,835.

(30) Foreign Application Priority Data

Jul. 16, 2009 (TW) ................................ 98124031 A

(51) Int. Cl.
*H01L 29/24* (2006.01)
*H01L 33/62* (2010.01)

(52) U.S. Cl.
CPC ...................................... *H01L 33/62* (2013.01)
USPC ................. 438/124; 438/26; 438/51; 438/55; 438/64; 438/106; 438/111; 438/123

(58) Field of Classification Search
USPC .......... 438/28, 51, 55, 64, 106, 111, 123, 124
See application file for complete search history.

(56) References Cited

U.S. PATENT DOCUMENTS

| 6,433,418 | B1 | 8/2002 | Fujisawa |
| 7,445,355 | B2 | 11/2008 | Wu |
| 2002/0140079 | A1 | 10/2002 | Takeyama |
| 2005/0280158 | A1 | 12/2005 | Crane, Jr. |
| 2008/0073762 | A1 | 3/2008 | Han |

FOREIGN PATENT DOCUMENTS

TW 097216261 9/1997

*Primary Examiner* — Thanh V Pham
(74) *Attorney, Agent, or Firm* — Christensen O'Connor Johnson Kindness PLLC

(57) ABSTRACT

An LED package with an extended top electrode and an extended bottom electrode is formed from a first metal and a second metal. An LED is on an inner end of the first metal. An outer end of the first metal has been bent upward twice 90 degrees to form a top flat as an extended top electrode of the package. An outer end of the second metal has been bent downward twice 90 degrees to form a bottom flat as an extended bottom electrode of the package. The LED and a bonding wire may be encapsulated with glue.

20 Claims, 7 Drawing Sheets

US 8,802,503 B2

PROCESSES FOR MANUFACTURING AN LED PACKAGE WITH TOP AND BOTTOM ELECTRODES

CROSS-REFERENCE TO RELATED APPLICATION

The present application is a division of U.S. patent application Ser. No. 14/014,324, filed Aug. 29, 2013, which is a division of U.S. patent application Ser. No. 13/548,067, filed Jul. 12, 2012, now U.S. Pat. No. 8,524,541, which is a division of U.S. patent application Ser. No. 12/554,189, filed Sep. 4, 2009, now U.S. Pat. No. 8,247,835, the disclosures of said applications are incorporated by reference herein in their entirety.

BACKGROUND

FIG. 1 is an LED cassette unit 200 which is disclosed in U.S. Pat. No. 7,445,355. The LED cassette unit 200 has a top metal electrode 21 and a bottom metal electrode 22. An insulation layer 25 is sandwiched in between the top metal electrode 21 and the bottom metal electrode 22. A center void is made in a center of the top metal electrode 21 and the insulation layer 25 to expose a center surface of the bottom metal electrode 22. An LED 20 is mounted on the bottom metal electrode 22 in the center void. A metal wire 24 electrically couples a top electrode of the LED 20 to the top metal electrode 21. A bottom electrode of the LED 20 electrically contacts the bottom metal electrode 22. Protection glue 23 encapsulates the metal wire 24 and the LED 20 for ensuring the quality and reliability of the LED package.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In accordance with aspects of the present disclosure, a manufacturing process is provided for making an LED package. The manufacturing process includes: mounting an LED on an inner end of a first metal, wherein the LED is electrically coupled to the first metal; electrically coupling the LED to an inner end of a second metal by a metal wire; bending an outer end of the first metal in a first direction to form a top electrode of the LED package; bending an outer end of the second metal in a second direction opposite of the first direction to form a bottom electrode of the LED package; and enclosing the LED and the metal wire in a protection molding.

In accordance with another aspect of the present disclosure, an LED package is provided. The LED package includes a first I metal having a beam, a pair of c-shaped metals, and a pair of inverse c-shaped metals. The LED package also includes a second metal having an inverse c shape with a top flat and a bottom flat, wherein the bottom flat of the second metal forms a bottom electrode of the LED package, an LED mounted on and electrically coupled to one of the beam of the first I metal or the top flat of the second metal, wherein the LED is electrically coupled by a metal wire to the other of the beam of the first I metal or the top flat of the second metal, and a protection molding enclosing the LED and the wire.

In some embodiments of the LED package, each of the c-shaped metals has a top flat and a bottom flat, wherein the bottom flats of the c-shaped metals extend from a first side of the beam and the top flats of the c-shaped metals form top electrodes of the LED package. In these embodiments and/or other embodiments of the LED package, each of the inverse c-shaped metals has a top flat and a bottom flat, wherein the bottom flats of the inverse c-shaped metals extend from a second side of the beam and the top flats of the inverse c-shaped metals forming top electrodes of the LED package.

In accordance with another aspect of the present disclosure, a manufacturing process is provided for making an LED package. The manufacturing process includes: mounting an LED on a beam of an I metal such that the LED is electrically coupled to the beam, wherein the I metal has a pair of c-shaped metals and a pair of inverse c-shaped metals; electrically coupling the LED to a second metal by a metal wire, wherein the second metal has an inverse c shape with a top flat and a bottom flat, and wherein the bottom flat of the second metal forms a bottom electrode of the LED package, and enclosing the LED and the metal wire in a protection molding.

In some embodiments of the manufacturing process, each of the c-shaped metals has a top flat and a bottom flat, wherein the top flats of the c-shaped metals form top electrodes of the LED package and the bottom flats of the c-shaped metals extend from a first side of the beam. In these and/or other embodiments of the manufacturing process, each of the inverse c-shaped metals has a top flat and a bottom flat, wherein the top flats of the inverse c-shaped metals form top electrodes of the LED package and the bottom flats of the inverse c-shaped metals extend from a second side of the beam.

In accordance with yet another aspect of the present disclosure, a manufacturing process is provided for making an LED package. The manufacturing process includes preparing a c-shaped metal by bending a first metal upwards twice 90 degrees, wherein the c-shaped metal has a top flat and a bottom flat, and wherein the top flat forms a top electrode of the LED package. The manufacturing process also includes preparing an inverse c-shaped metal by bending a second metal downwards twice 90 degrees, wherein the inverse c-shaped metal has a top flat and a bottom flat, and wherein the bottom flat forms a bottom electrode of the LED package. The manufacturing process further includes electrically coupling an LED to the bottom flat of the c-shaped metal and to the top flat of the inverse c-shaped metal, and enclosing the LED in a protection molding.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

An improved manufacturing process to manufacture an LED package with a top electrode and a bottom electrode is disclosed. The process includes preparing a piece of metal sheet, forming a pair of coplanar metals, namely, a first metal and a second metal, mounting an LED chip on an inner end of the first metal, wire-bonding a top electrode of the LED chip to an inner end of the second metal, molding to protect at least the LED chip and the bonding wire, bending an outer end of the first metal upward to form an extended flat top electrode, and bending an outer end of the second metal downward to form an extended bottom flat electrode.

FIGS. 2A, 2B, 3A, and 3B show different views of a first embodiment according to the present disclosure.

Figure 1:
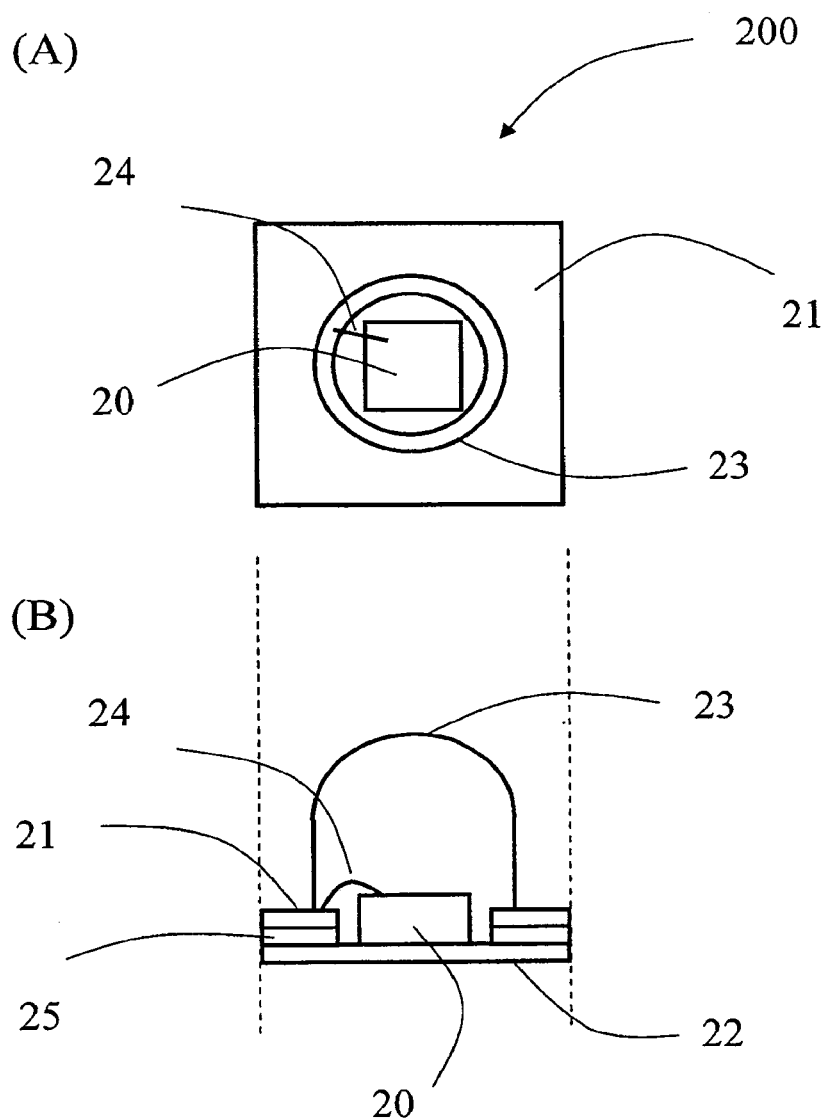
FIG. 1A shows a top view of a prior art LED cassette unit.
FIG. 1B shows a side view of the prior art LED cassette unit.
Figure 2:
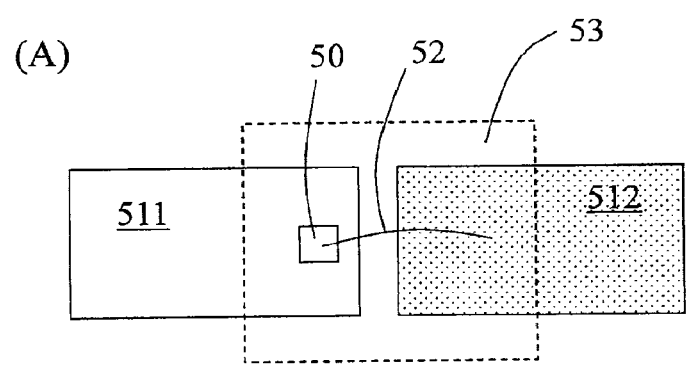
FIG. 2A shows a top view of a first embodiment of an LED package prior to bending in accordance with one or more embodiments of the present disclosure.
FIG. 2B shows a side view of the first embodiment of the LED package prior to bending in accordance with one or more embodiments of the present disclosure.
Figure 2:
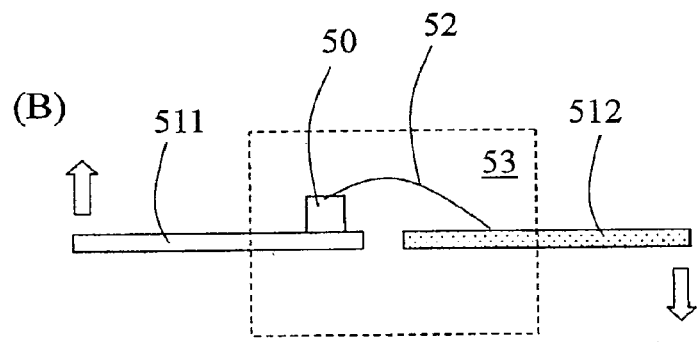

FIG. 2A shows a first embodiment before bending the metals according to the present disclosure. The process includes: (1) preparing a single piece of metal sheet (not shown), (2) forming a first metal 511 and a coplanar second metal 512 by, for example, punching the single piece of metal sheet, (3) mounting an LED 50 on an inner end of the first metal 511 and electrically coupling a bottom electrode of the LED 50 to the first metal 511, (4) electrically coupling a top electrode of the LED 50 to an inner end of the second metal 512 through wire-bonding with a metal wire 52, and (5) protection-molding with glue 53 for fixing and protecting at least the LED 50, the wire 52, and the inner ends of the two metals 511, 512.

FIG. 2B shows a side view of FIG. 2A. An outer end of the first metal 511 exposed outside of the glue 53 is going to be bent upward, and an outer end of the second metal 512 exposed outside of the glue 53 is going to be bent downward.

Figure 3:
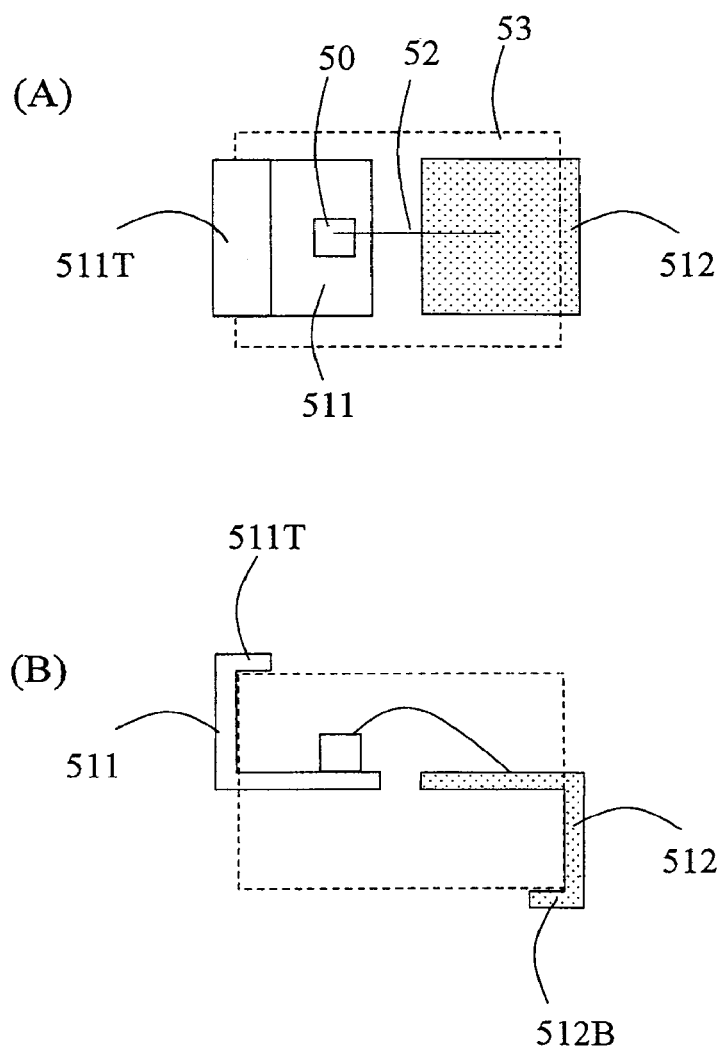
FIG. 3A shows a top view of the first embodiment of the LED package after bending in accordance with one or more embodiments of the present disclosure.
FIG. 3B shows a side view of the first embodiment of the LED package after bending in accordance with one or more embodiments of the present disclosure.

FIG. 3A shows a top view after bending of the metals 511, 512 according to the present disclosure. The outer end of the first metal 511 is bent upward twice 90 degrees to form a top flat 511T as a first extended electrode. The outer end of the second metal 512 is bent downward twice 90 degrees to form a bottom flat 512B (shown in FIG. 3B) as a second extended electrode.

FIG. 3B shows a side view of FIG. 3A. The outer end of the first metal 511 is bent to form a c-shaped top flat 511T as a top electrode of the package. The outer end of the second metal 512 is bent to form an inverse c-shaped bottom flat 512B as a bottom electrode of the package.

FIGS. 4A, 4B, 5A, 5B, and 6A-6D show different views of a second embodiment according to the present disclosure.

Figure 4:
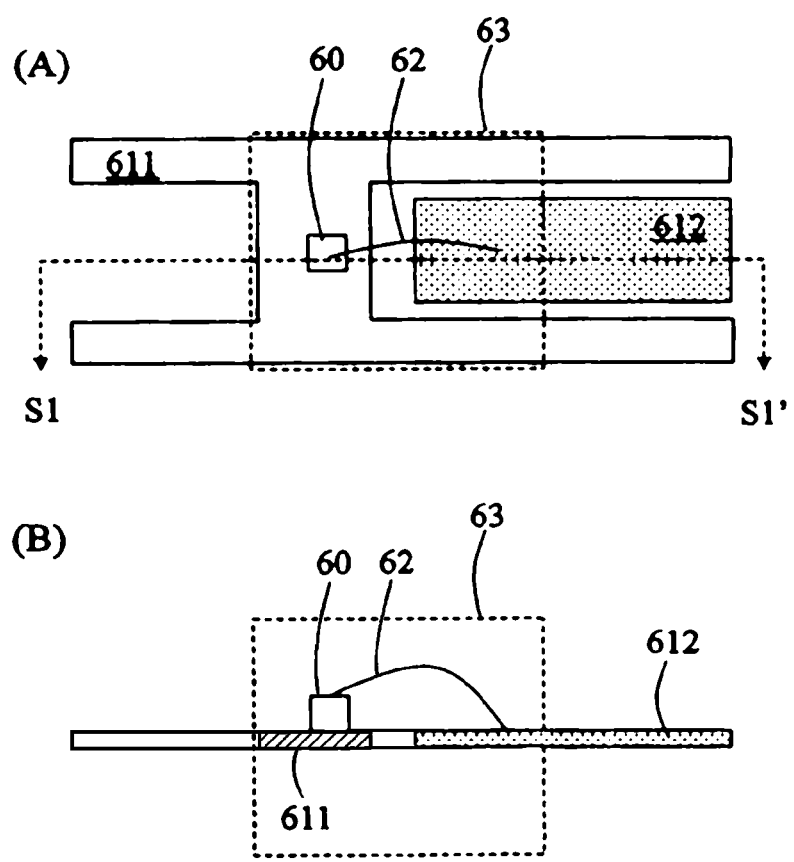
FIG. 4A shows a top view of a second embodiment of an LED package prior to bending in accordance with one or more embodiments of the present disclosure.
FIG. 4B shows a side view of the second embodiment of the LED package prior to bending in accordance with one or more embodiments of the present disclosure.

FIG. 4A shows a second embodiment before bending the metals according to the present disclosure. The process includes: (1) preparing a single metal sheet (not shown), (2) forming an I metal 611 (first metal) and a coplanar rectangular metal 612 (second metal); the I metal 611 has a vertical beam, a first pair of horizontal legs extended from a first side of the vertical beam, and a second pair of horizontal legs extended from a second side of the vertical beam; the rectangular metal 612 is located in between one of the two pairs of horizontal legs, (3) mounting an LED 60 on the vertical beam of the I metal 611, electrically coupling a bottom electrode of the LED 60 to the I metal 611 through direct contact, (4) electrically coupling a top electrode of the LED 60 to an inner end of the rectangular metal 612 through wire-bonding with a metal wire 62, and (5) protection-molding with glue 63 for fixing and protecting at least the LED 60, the metal wire 62, and the inner end of the rectangular metal 612.

FIG. 4B shows a side view of FIG. 4A. Outer ends of the four horizontal legs of the I metal 611 are exposed outside of the glue 63, with each of the four horizontal legs to be bent upward, and an outer end of the rectangular metal 612 exposed outside of the glue 63 to be bent downward.

Figure 5A:
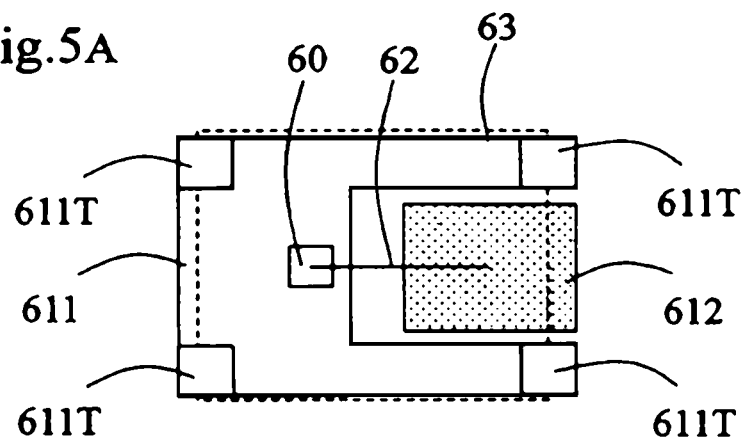
FIG. 5A shows a top view of the second embodiment of the LED package after bending in accordance with one or more embodiments of the present disclosure.

FIG. 5A shows a top view after bending the horizontal legs of the I metal 611 and the rectangular metal 612 according to the present disclosure. Each of the outer ends of the four horizontal legs of the I metal 611 is bent upward twice 90 degrees to form four top flats 611T as extended top electrodes of the LED package. The outer end of the rectangular metal 612 is bent downward twice 90 degrees to form a bottom flat 612B (FIG. 5B) as an extended bottom electrode of the LED package.

Figure 5B:
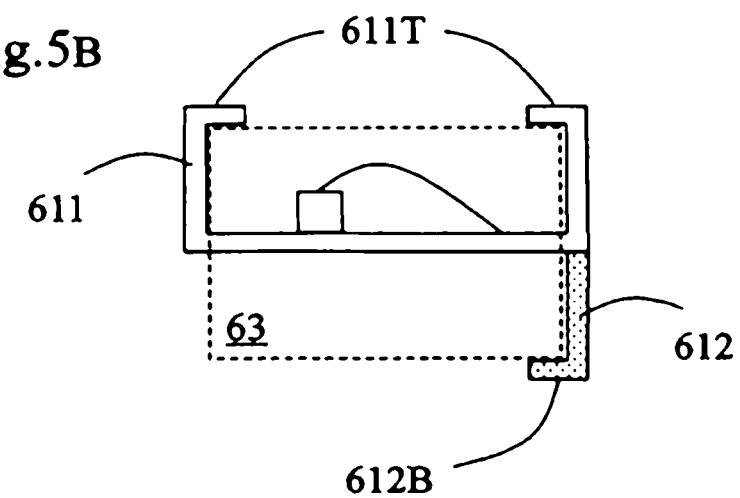
FIG. 5B shows a side view of the second embodiment of the LED package after bending in accordance with one or more embodiments of the present disclosure.

FIG. 5B shows a side view of FIG. 5A. The first pair of horizontal legs from the first side of the I metal 611 are bent to form a pair of c-shaped metals with two top flats 611T, a first top electrode and a second top electrode of the package. The second pair of horizontal legs from the second side of the I metal 611 are bent to form a pair of inverse c-shaped metals with two top flats 611T as a third top electrode and a fourth top electrode of the package. The rectangular metal 612 is bent to form an inverse c-shaped metal with the bottom flat 612B as a bottom electrode of the LED package.

Figure 6A:
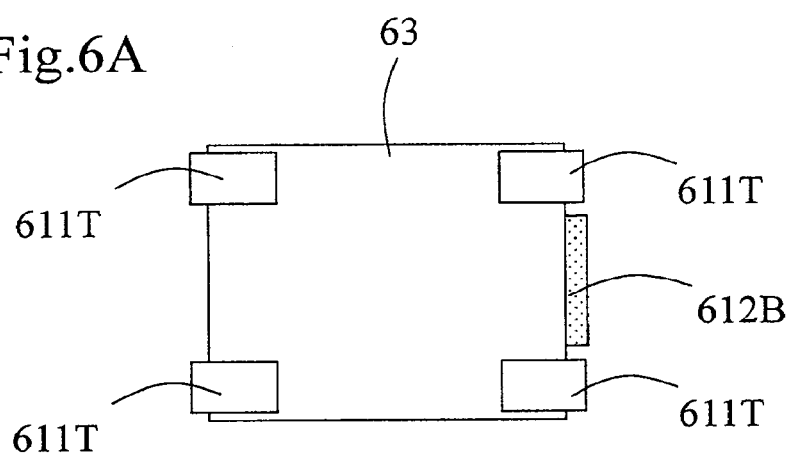
FIG. 6A shows a top view of the second embodiment of the LED package after bending in accordance with one or more embodiments of the present disclosure.

FIG. 6A shows a top view of the LED package shown in FIGS. 5A and 5B. Four top flats 611T are shown which function as extended top electrodes of the LED package.

Figure 6B:
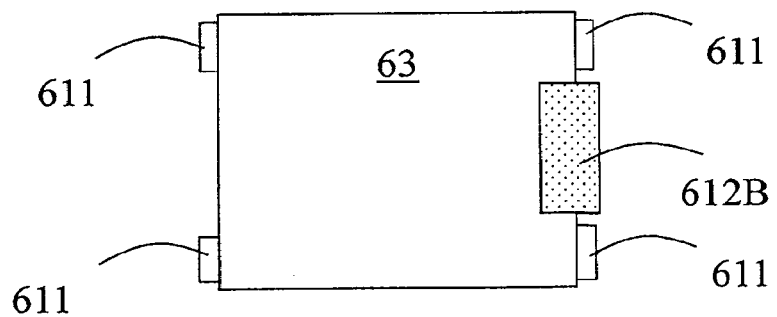
FIG. 6B shows a bottom view of the second embodiment of the LED package after bending in accordance with one or more embodiments of the present disclosure.

FIG. 6B shows a bottom view of the LED package shown in FIGS. 5A and 5B. The bottom flat 612B is shown which functions as a bottom electrode of the LED package.

Figure 6C:
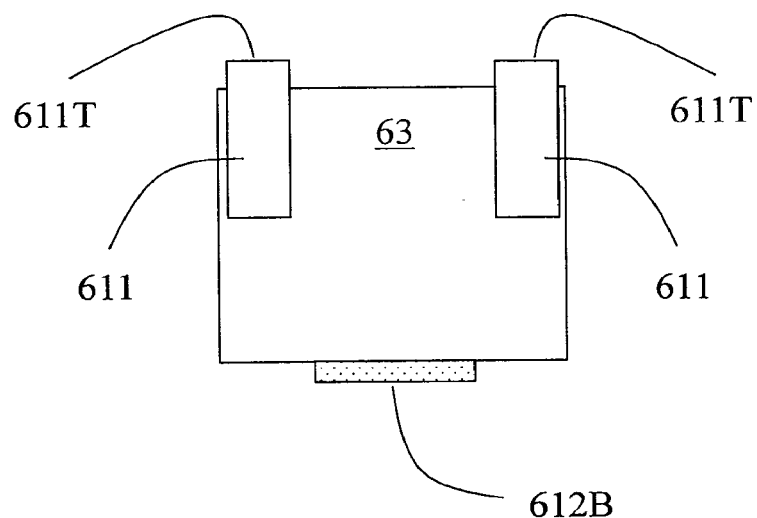
FIG. 6C shows a side view of the second embodiment of the LED package after bending in accordance with one or more embodiments of the present disclosure.

FIG. 6C shows a first side view of the LED package shown in FIGS. 5A and 5B. The first pair of horizontal legs from the first side of the I metal 611 and the two top flats 611T are shown on the first side of the LED package.

Figure 6D:
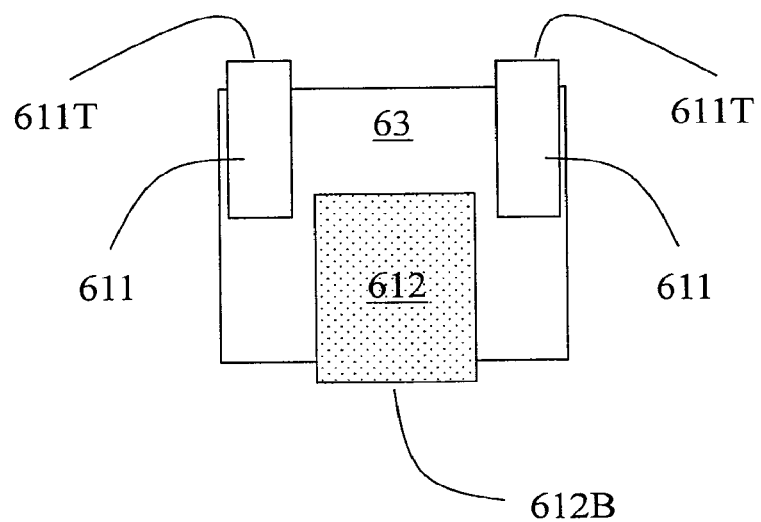
FIG. 6D shows another side view of the second embodiment of the LED package after bending in accordance with one or more embodiments of the present disclosure.

FIG. 6D shows a second side view of the LED package shown in FIGS. 5A and 5B. The second pair of horizontal legs from the second side of the I metal 611, the two top flats 611T, and the rectangular metal 612 are shown on the second side of the LED package.

While several embodiments have been described by way of example, it will be apparent to those skilled in the art that various modifications may be made without departing from the spirit of the claimed subject matter. Such modifications are all within the scope of the present disclosure, as defined by the appended claims.

The embodiments of the invention in which an exclusive property or privilege is claimed are defined as follows:

1. A manufacturing process for making an LED package, the manufacturing process comprising:
mounting an LED on a beam of an I metal such that the LED is electrically coupled to the beam, wherein the I metal includes at least one c-shaped metal and at least one inverse c-shaped metal;
electrically coupling the LED to a second metal by a metal wire, wherein the second metal has an inverse c shape; and
enclosing the LED and the metal wire in a molding.

2. The manufacturing process of claim 1, wherein the at least one c-shaped metal of the I metal has a top flat and a bottom flat, wherein the top flat of the at least one c-shaped metal forms at least one top electrode of the LED package and the bottom flat of the at least one c-shaped metal extends from a first side of the beam.

3. The manufacturing process of claim 2, further comprising enclosing the bottom flat of the at least one c-shaped metal in the molding.

4. The manufacturing process of claim 3, wherein said enclosing the LED and the metal wire in a molding comprises leaving a top surface of the top flat of the at least one c-shaped metal outside the molding as the at least one top electrode of the LED package.

5. The manufacturing process of claim 2, wherein the at least one inverse c-shaped metal of the I metal has a top flat and a bottom flat, wherein the top flat of the at least one inverse c-shaped metal forms at least one top electrode of the LED package and the bottom flat of the at least one inverse c-shaped metal extends from a second side of the beam.

6. The manufacturing process of claim 5, further comprising enclosing the bottom flat of the at least one inverse c-shaped metal in the molding.

7. The manufacturing process of claim 6, wherein the second metal has a top flat and a bottom flat, and wherein said enclosing the LED and the metal wire in the molding comprises leaving a bottom surface of the bottom flat of the second metal outside the molding as a bottom electrode of the LED package.

8. The manufacturing process of claim 1, further comprising enclosing the beam in the molding.

9. The manufacturing process of claim 2, wherein the second metal has a top flat and a bottom flat, and wherein the bottom flat of the second metal forms a bottom electrode of the LED package.

10. The manufacturing process of claim 1, further comprising enclosing a bottom flat of the at least one c-shaped metal in the molding.

11. The manufacturing process of claim 1, further comprising enclosing a bottom flat of the at least one inverse c-shaped metal in the molding.

12. The manufacturing process of claim 1, wherein the second metal has a top flat and a bottom flat, the method further comprising enclosing the top flat of the second metal in the molding.

13. The manufacturing process of claim 1, wherein the second metal has a top flat and a bottom flat, the method further comprising placing the beam of the I metal and the top flat of the second metal in a coplanar position.

14. A manufacturing process for making an LED package, the manufacturing process comprising:
mounting an LED on a vertical beam such that the LED is electrically coupled to the beam, wherein the vertical beam has a first pair of horizontal legs extending from a first side of the vertical beam and a second pair of horizontal legs extending from a second side of the vertical beam;
bending the first and second pairs of legs to form four top electrodes of the LED package;
bending a portion of the second metal to form a bottom electrode of the LED package;
electrically coupling the LED to the second metal by a metal wire; and
enclosing the LED and the metal wire in a molding.

15. The manufacturing process of claim 14, wherein each of the four top electrodes includes a flat portion.

16. The manufacturing process of claim 14, wherein the bottom electrode includes a flat portion.

17. The manufacturing process of claim 14, wherein the vertical beam includes a portion that is coplanar with a portion of the second metal.

18. The manufacturing process of claim 14, wherein said bending a portion of the second metal to form a bottom electrode of the LED package comprises bending the second metal downwards twice to form the bottom electrode of the LED package.

19. The manufacturing process of claim 14, wherein said bending the first and second pairs of legs to form four top electrodes of the LED package comprises bending each of the legs upward twice to form the four top electrodes of the LED package.

20. The manufacturing process of claim 14, wherein said bending the first and second pairs of legs to form four top electrodes of the LED package comprises bending the first pair of horizontal legs such that each leg of the first pair of horizontal legs includes a first shape and bending the second pair of horizontal legs such that each leg of the second pair of legs includes a second shape that is an inverse of the first shape.

* * * * *